United States Patent [19]
Idei et al.

[11] Patent Number: 5,386,139
[45] Date of Patent: Jan. 31, 1995

[54] SEMICONDUCTOR LIGHT EMITTING ELEMENT WITH IMPROVED STRUCTURE OF GROOVE THEREIN

[75] Inventors: Yasuo Idei, Tama; Toshio Shimizu, Zama, both of Japan

[73] Assignee: Kabushiki Kaisha Toshiba, Kanagawa, Japan

[21] Appl. No.: 46,973

[22] Filed: Apr. 15, 1993

[30] Foreign Application Priority Data

Apr. 16, 1992 [JP] Japan .................. 4-096400

[51] Int. Cl.⁶ ............ H01L 27/14; H01L 31/00; H01L 33/00; H01S 3/19
[52] U.S. Cl. .................. 257/466; 257/443; 257/446; 257/452; 257/618; 257/622; 257/88; 257/93; 257/96; 257/99; 372/46; 372/48; 372/50
[58] Field of Search .......... 257/96, 99, 79, 88, 257/93, 443, 444, 445, 446, 452, 466, 618, 622; 372/46, 48, 50

[56] References Cited

U.S. PATENT DOCUMENTS

| | | | |
|---|---|---|---|
| 4,916,710 | 4/1990 | Hattori | 372/50 |
| 5,060,237 | 10/1991 | Peterson | 372/50 |
| 5,073,806 | 12/1991 | Idei | 257/96 |
| 5,091,757 | 2/1992 | Yoshida | 372/50 |

FOREIGN PATENT DOCUMENTS 61-168283 7/1986 Japan .................. 372/50

*Primary Examiner*—Andrew J. James
*Assistant Examiner*—Alice W. Tang
*Attorney, Agent, or Firm*—Finnegan, Henderson, Farabow, Garrett & Dunner

[57] ABSTRACT

A semiconductor light emitting element in which light leakage from the vicinity of an active layer end thereof is significantly reduced, and an interval at which the element is disposed is sufficiently narrow, so that there can be realized an optimal distance-measuring accuracy when used for a light source of a camera's automatic focusing mechanism. The semiconductor light emitting element includes a double heterojunction structure such that a GaAlAs current restriction layer formed with a conductive region is formed on a GaAs semiconductor substrate and a light emitting region of the light emitting element diode is provided therein by forming a p-n junction surfaces, the semiconductor light emitting element being characterized in that a plurality of the light emitting diodes are electrically isolated from each other by a plurality of grooves formed substantially vertical to the p-n junction and an end face of the light emitting region cut through by the groove is disposed inside a vertical line drawn from an end face of the surface of the light emitting element.

6 Claims, 6 Drawing Sheets

$\beta < \alpha$

SEMICONDUCTOR LIGHT EMITTING ELEMENT WITH IMPROVED STRUCTURE OF GROOVE THEREIN

BACKGROUND OF THE INVENTION

1. Field of the Invention

The present invention relates to a semiconductor light emitting element such as a monolithic type LED (light emitting diode) which is equipped with a light emitting region formed on a GaAs substrate where an p-n junction surface is made of material such as GaAlAs. The present invention more particularly relates to the semiconductor light emitting element suitable for use as an infrared light source for an automatic focusing mechanism assembled in a camera and where light leakage from an end of the light emitting region is minimized, an interval between the light emitting elements is relatively narrow, and a reliable distance-measuring capability is achieved.

2. Description of the Prior Art

With reference to FIG. 1, there is shown a cross sectional view of the conventional semiconductor light emitting element. In the same figure, the semiconductor light emitting element is a monolithic type GaAlAs As infrared LED and is equipped with three-point light emitting elements.

With still reference to FIG. 1, the conventional semiconductor light emitting element presents the following structure, wherein conductive regions 108 are formed on a p type GaAs substrate 106. The element includes a double heterojunction (DH) structure such that a GaAlAs As current restriction layer formed with the conductive region 108 is formed on the substrate 106. The double heterojunction type GaAlAs As layer includes an n-type $Ga_{l-x}Al_x$ As current restriction layer 105, a p-type $Ga_{l-w}Al_w$ As cladding layer 104, a p-type $Ga_{l-z}Al_z$ As active layer 103, and an n-type $Ga_{l-y}Al_y$ As cladding layer 102 which are formed in sequence. Then, an ohmic electrode 101 is formed on the cladding layer 102 and is opened so that the light can be emitted externally from the conductive region 108. Thereafter, the light emitting elements adjacent to each other are electrically isolated by performing a halfway dicing on a region between adjacent light emitting elements so as to cut through a p-n Junction. As a result thereof, respective light emitting elements are independently operative. Here, the halfway dicing means a dicing which does not perform a full-cut dicing.

When the semiconductor light emitting element thus constructed above is, for example, adopted for a light source of infrared rays for a camera's automatic focusing mechanism, the infrared rays emitted therefrom are passed through a collimator lens into a parallel beam toward a subject. Thus, the light reflected from the subject is sensed by a light receiving element, and a distance to the subject is measured in accordance with a trigonometrical survey method.

In the above-mentioned conventional example, there is used the halfway dicing technique as an electrically isolating means. Therefore, when a light emitting element is, for example, rendered conductive, a light h' guided by the p-type $Ga_{l-z}Al_z$ As active layer 103 is irradiated externally from dicing grooves, together with a light h from the conductive region 108 (see FIG. 1). Then, consulting a near field pattern which indicates a light density of light emitted from the semiconductor light emitting element, the light h' irradiated from the p-type $Ga_{l-z}Al_z$ As active layer 103 shows a significant level of density against the light h emitted from the surface of the conductive region 108. It is to be noted here that the light h' is an unwanted light which may be a major cause for inaccurate distance measuring.

For example, when used as the light source for the automatic focusing mechanism, the light h' irradiated from the grooves, that is, the light h' which is leaked laterally from the p-type $Ga_{l-z}Al_z$ As active layer 103, may be detected by the light receiving element so as to indicate an improper distance between the camera and the subject, so that there is caused an out-of-focus problem or the like. In order to alleviate such a problem with reference to FIG. 1, there is provided a sufficient interval d between the conductive regions 108 and the end faces of active layer 103 at the groove sidewalls, so that the unwanted light can be damped and the lateral unwanted light can be suppressed.

With reference to FIG. 6, there is shown a relationship between the distance d and the relative light density (h') at the end of LED element relative to that of conductive region (h). For example, in order to suppress the relative density to 3% or therebelow, the interval d needs to be more than 80 μm. However, there is a limit in reducing the distance d between the light emitting elements and there lies a great difficulty in achieving a semiconductor light emitting element where the interval d is minimal and a distance measuring performance is optimal at the same time.

The halfway dicing accounts for the cause for light leakage. In other words, with reference to FIG. 5 which is an enlarged view of a portion circled by doted lines in FIG. 1, a shape realized by the dicing is an acute-angled surface. That is, an opening interval d1 in the surface of the light emitting element is greater than an interval d2 of the light emitting region in the vicinity of the p-type $Ga_{l-z}Al_x$ As active layer 103. For instance, when depth of the halfway dicing is 60 μm, opening interval d1 would be 35 μm and the interval d2 be 32 μm. Thereby, a portion of light irradiated from the end of the light emitting active layer 103 is detected at an upper portion of the semiconductor light emitting element.

As mentioned above, since there is commonly used the halfway dicing and the shape of element isolating portion is of the acute angled type in the conventional semiconductor light emitting element, the light is leaked in the lateral directions from the isolating portion. In order to alleviate such the problem, there is provided an increased interval between the light emitting elements, so that the light is damped and the laterally leaked light is suppressed. However, the conventional technique set a limit in further dense integration therefor. Moreover, when, for example, used for the light source for the camera's automatic focusing mechanism, there lies great difficulty in realizing a semiconductor light emitting element in which the interval therebetween is minimal and a distance-measuring accuracy is maximal.

SUMMARY OF THE INVENTION

In view of the foregoing problems, the object of the present invention is to provide a semiconductor light emitting element in which the light leakage from the vicinity of the active layer end is significantly reduced, and the interval at which the element is disposed is sufficiently reduced, so that there can be realized an optimal distance-measuring accuracy when used, for example, for the light source of the camera's automatic focusing mechanism. Therefore, there is provided a semiconductor light emitting element comprising a double heterojunction structure such that a GaAlAs As current restriction layer formed with a conductive region is formed on a GaAs semiconductor substrate and a light emitting region of light emitting diode is provided therein by forming an p-n junction surfaces, the semiconductor light emitting element being characterized in that a plurality of the light emitting diodes are electrically isolated by a plurality of grooves formed substantially vertical to the p-n junction surfaces and an end face of the light emitting region cut through by the groove is disposed inside a vertical line drawn from an end face of the surface of the light emitting element.

Other features and advantages of the present invention will become apparent from the following description taken in conjunction with the accompanying drawings.

DETAILED DESCRIPTION OF THE PREFERRED EMBODIMENTS

Features of the present invention will become apparent in the course of the following description of exemplary embodiments which are given for illustration of the invention and are not intended to be limiting thereof. Embodiments of the present invention will now be described with reference to the drawings.

Figure 1:
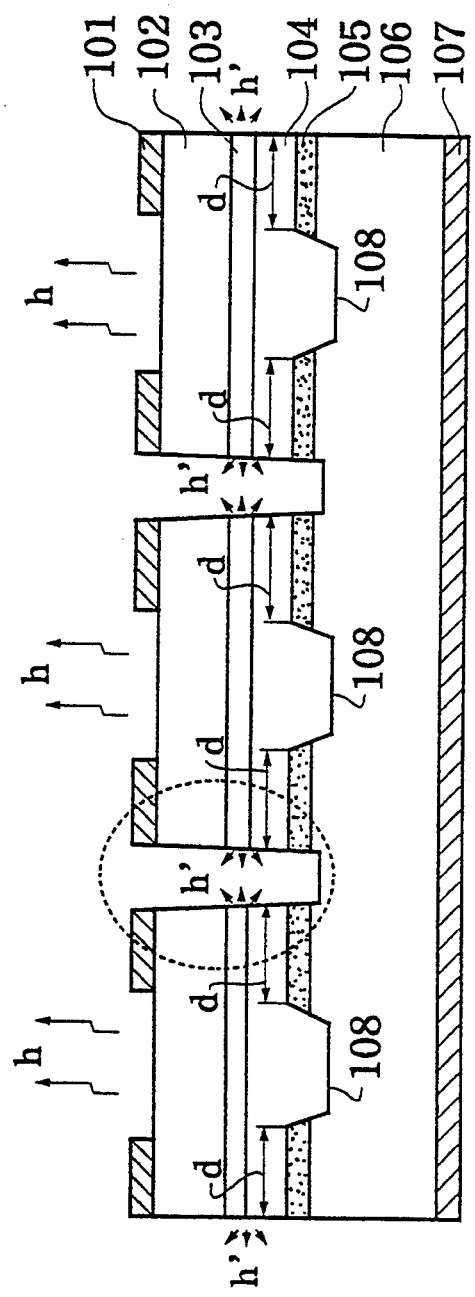
FIG. 1 shows a cross section of the conventional semiconductor light emitting element.
Figure 2:
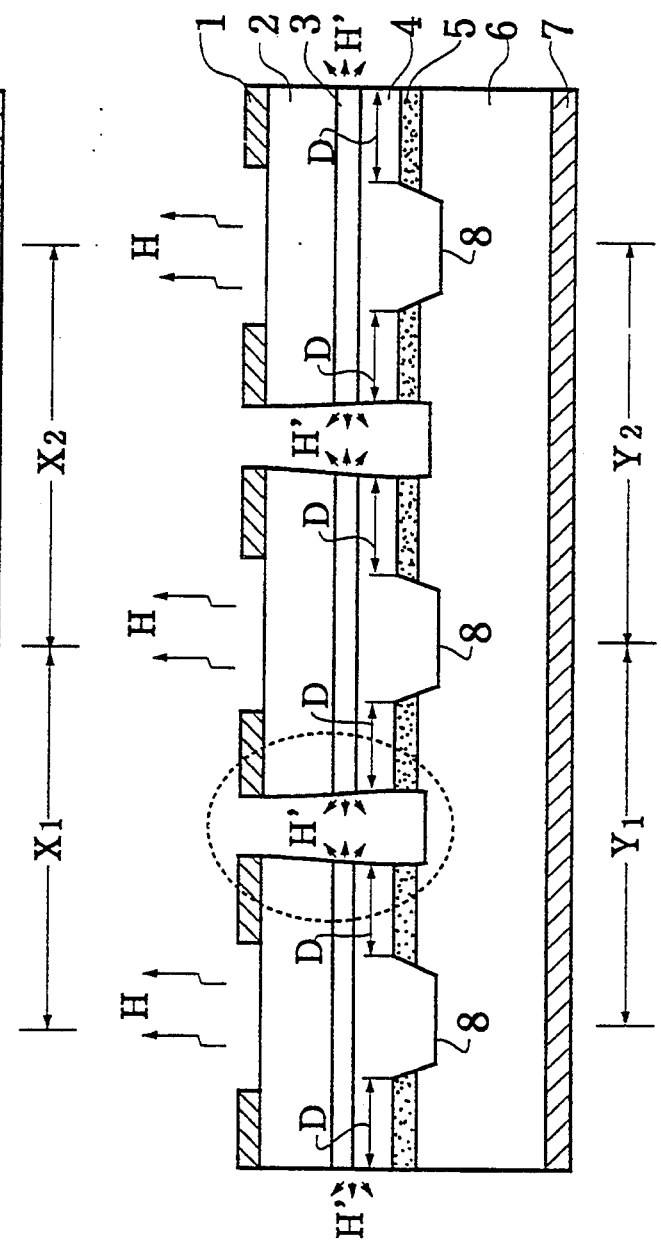
FIG. 2 shows a cross section of a basic semiconductor light emitting element according to the present invention.

With reference to FIG. 2, there is shown a cross section of a basic semiconductor light emitting element according to the present invention. The semiconductor light emitting element is a double hetero structure (DH) monolithic type GaAlAs As LED (light emitting diode) and is equipped with three emitting element points.

FIG. 3A through 3D show cross sectional views of process sequence for producing the semiconductor light emitting element shown in FIG. 2.

Figure 3A:
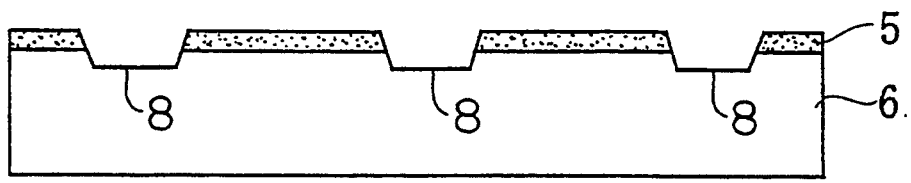
FIG. 3A through 3D show cross sectional views of a process sequence for producing the semiconductor light emitting element shown in FIG. 2.

In the same figures, first of all, with reference to FIG. 3A, there is formed an n type GaAs current restriction layer 5 having a plurality of conductive regions 8 at an arbitrary interval Y1, Y2, on a p type Ga As substrate 6. Then, an impurity concentration of the current restriction layer 5 is $5 \times 10^{17}$ cm$^{-3}$, and a thickness therefor is 5 $\mu$m.

Next, there are formed in sequence a p type Ga0.7-Al0.3-As cladding layer 4, a p type Ga0.97-Al0.03-As active layer 3 and an n type Ga0.7-Al0.3-As cladding layer 2 so as to form a GaAlAs As layer of double hereto structure. Then, the impurity concentration for the cladding layer 4 was $1 \times 10^{18}$ cm$^{-3}$ and the thickness therefor was 5 $\mu$m. The impurity concentration for the active layer 3 was $1 \times 10^{17}$ cm$^{-3}$ and the thickness therefor was 1 $\mu$m. The impurity concentration for the cladding layer 2 was $1 \times 10^{18}$ cm$^{-3}$ and the thickness therefor was 10 $\mu$m.

Figure 3B:
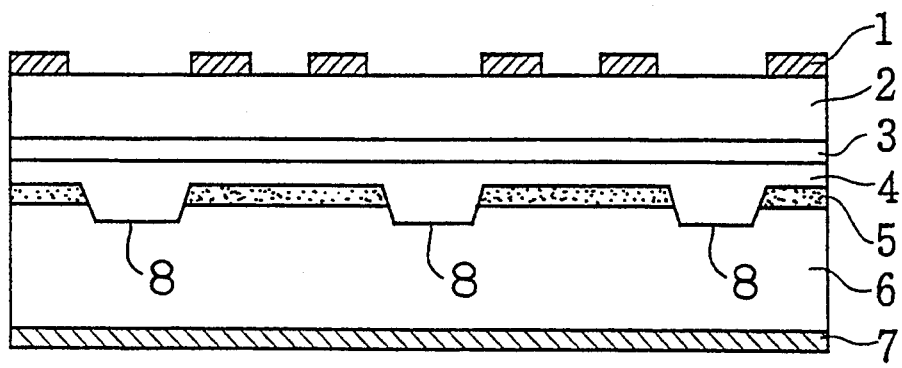

Next, with reference to FIG. 3B, there is formed an ohmic electrode 1 having an opening portion therein so that the light emitted from the conductive region 8 can be emitted externally through the opening portion. Then, the electrode on the GaAlAs As layer adjacent to each element is removed using a photoresist patterning method.

Figure 3C:
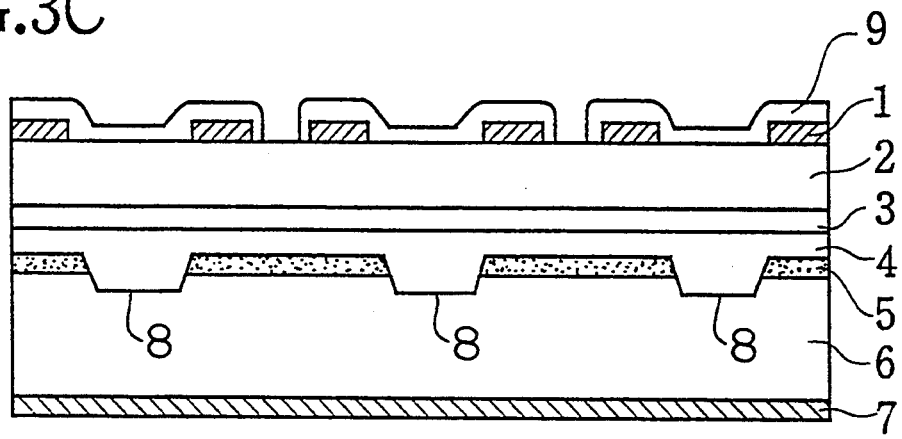

Thereafter, with reference to FIG. 3C, on a GaAlAs wafer there is formed a protection mask such as a SiO$_2$ sputtering film 9 for reactive ion etching (RIE) so that the opening portions are etched by the reactive ion etching (RIE) technique.

Figure 3D:
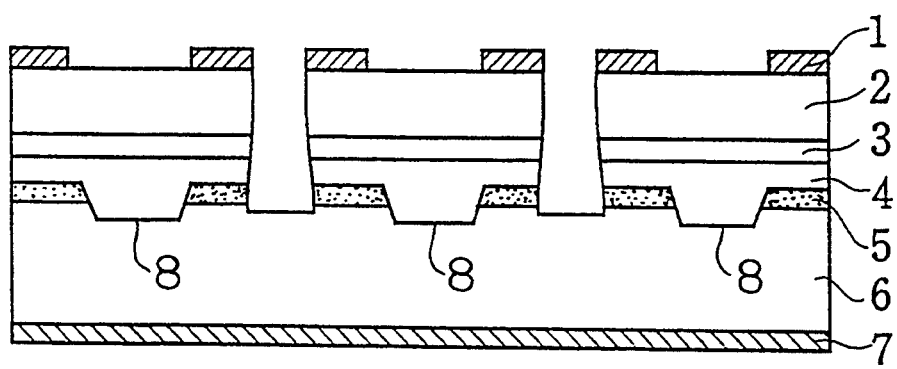
Figure 4:
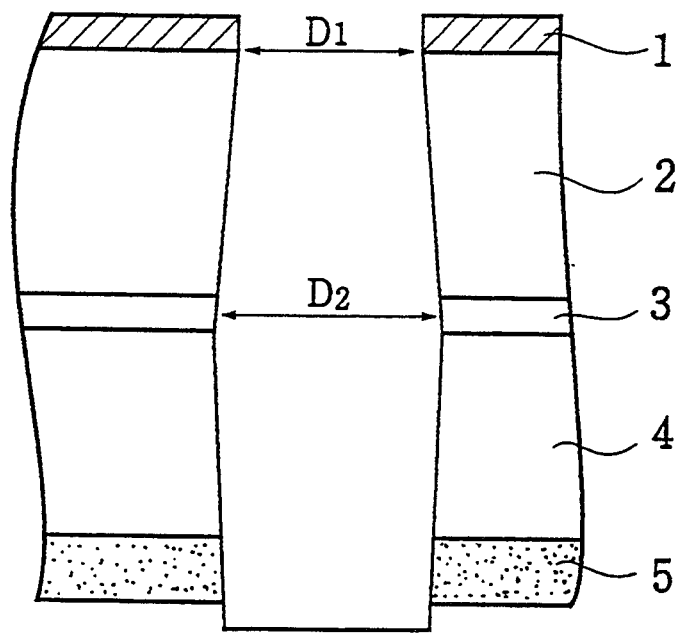
FIG. 4 shows an enlarged cross sectional view for an isolation portion according to the present invention.
Figure 5:
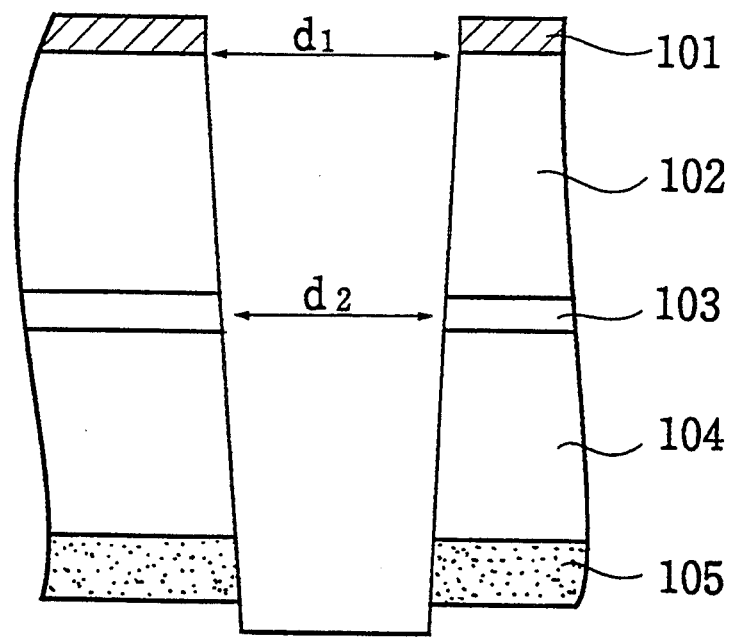
FIG. 5 shows an enlarged cross sectional view for the isolation portion according to the conventional practice.

Thereafter, with reference to FIG. 3D, the above wafer is set in a dry etching vessel, and then reactive gases comprising boron trichloride (BCl$_3$) and chlorine (Cl$_2$) are introduced into the vessel so as to be excited to a plasma state by means of discharge or the like. As a result thereof, there is made an active seed such as a halogen radical and ion, thereafter, etching is performed by a reaction with the GaAlAs As material or a sputtering operation. Here, FIG. 4 shall be referred to, which shows an enlarged cross sectional view for an isolation portion. Then, argon (At) is introduced to utilize the sputtering action thereof so that interval D2 of the light emitting region in the vicinity of the active region 3 can be made equal to or greater than the interval D1 of the light emitting element surface by means of etching in a state of anisotropic etching. It shall be appreciated that there may be used gases among SiCl$_4$, HCl, PCl$_3$, CH$_4$ plus H$_2$, BBr$_3$ and HBr for an etching purpose.

More specifically, a gas flow rate of BCl$_3$ was 40 SCCM, a Cl$_2$ gas flow rate was 15 SCCM, an Ar gas flow rate was 30 SCCM, and a pressure in the vessel was 0.05 Torr. Moreover, a etching rate then was approximately 2 $\mu$m/minute. In order to ensure to that electrically isolation is secured after the RIE was carried out, a shape of the element was such that a depth of the etching was 25 $\mu$m, interval D1 between the adjacent element surfaces was 30 $\mu$m, and interval D2 of the active layer 3 which is the p type Ga0.97-Al0.3-As layer was 32 $\mu$m.

Thereby, even if the light leaked from the p type Ga0.97-Al0.3-As active layer 3 is guided toward the upper surface of the element, such leaked light is reflected by the GaAlAs As crystal so as to maximally suppress the light from being emitted externally.

Figure 6:
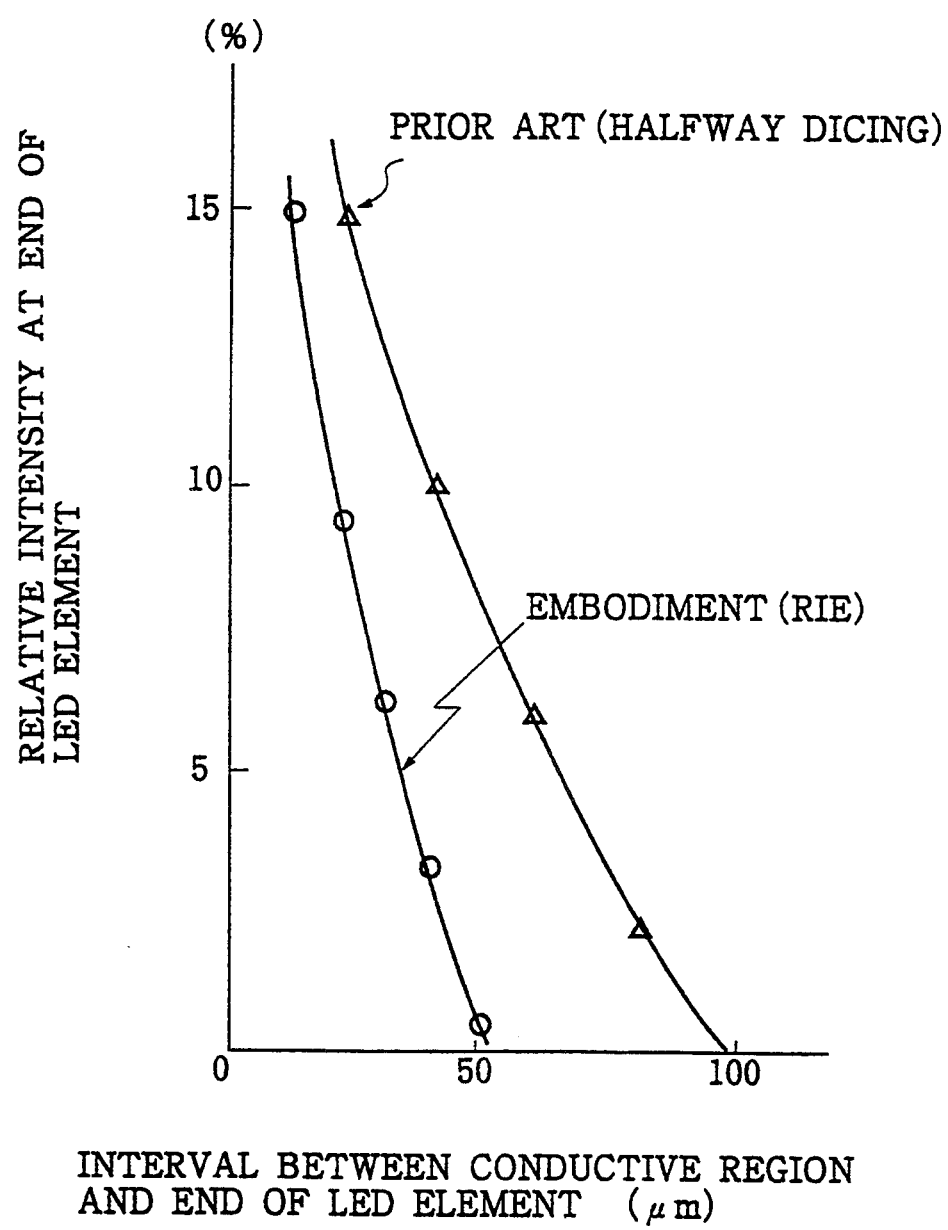
FIG. 6 is a graph to show correlation of light intensity between the interval between the conductive region and the light emitting element, and at the end of the conductive region .

FIG. 6 shows correlation of a relative intensity between interval D between the conductive region 8 and the end of the light emitting element (as shown in FIG. 2), and the end of the conductive region. In the same figure, it is known that interval D can be as short as a half of that in the conventional halfway dicing technique, against the same intensity.

In order to avoid an erroneous measurement due to light leakage from the end of the light emitting element if used for the automatic focusing mechanism, there is necessity in that the relative density shall be below 3%. In this case, there is needed approximately 80 μm for the interval d in the conventional practice. In contrast thereto, there is needed approximately 40 μm in the present invention, thus reducing such an interval by half.

Though not shown in FIG. 6, a substantially same effect is observed by the present invention when the distance D1 is approximately equal to the interval D2 which is an interval of the light emitting region in the vicinity of the active layer 3.

Though aforementioned of the DH monolithic type GaAlAs As LED, it shall be appreciated that a single heterostructure (SH) GaAlAs LED may serve a same purpose in this present invention.

Moreover, stoichiometric ratios x, y, z, w of Al in DH are preferred to satisfy the following relation in the n type $Ga_{l-y}Al_y As$ cladding layer 2, the p type $Ga_{l-z}Al_z As$ active layer 3, the p type $Ga_{l-w}Al_w As$ cladding layer 4, and the n type $Ga_{l-x}Al_x As$ current restriction layer 5.

$0 \leq x, z \leq 0.4$ $z < y, w$

For example, in the above embodiments for an infrared LED, an Al mixed stoichiometric ratio for the p type $Ga_{l-z}Al_z As$ active layer 3 was 0.03. However, the Al mixed ratio z for the active layer 3 may be adopted to a range of 0.3 through 0.4 where the ratio becomes a direct transition type from infrared to red region.

Moreover, the light leakage also occurs in the light emitting region surrounding the monolithic LED element which is located in the vicinity of the active layer 3, thus also causing the erroneous automatic focusing measurement.

Therefore, when the end face of the light emitting region is located inside a vertical line drawn from the the surface of the light emitting element, the erroneous measurement can be further securely avoided.

With reference to FIGS. 7A through 7C and FIGS. 8A-8B, there are shown various shapes for the isolating grooves.

Figure 7A:
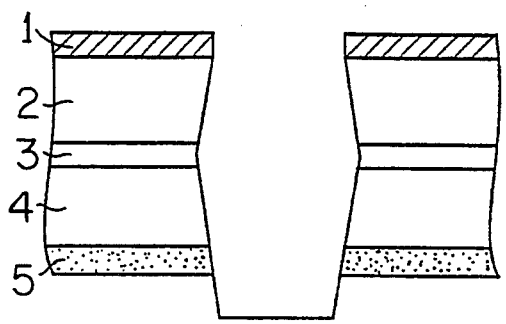
FIGS. 7A through 7C show other various shapes of the isolating grooves encircled by dotted lines shown in FIG. 2.
Figure 7B:
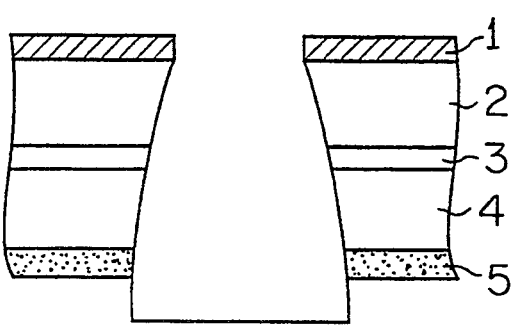
Figure 7C:
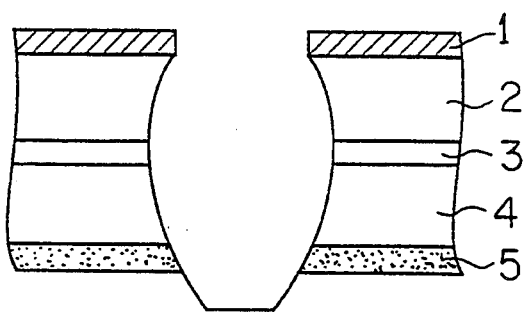

FIG. 7A shows the isolating groove where a shape thereof caused by an RIE process is of a linearly shaped type. FIG. 7B shows the isolating groove whose base portion is etched relatively wider. FIG. 7C shows the isolating groove having a certain curvature therealong.

Figure 8A:
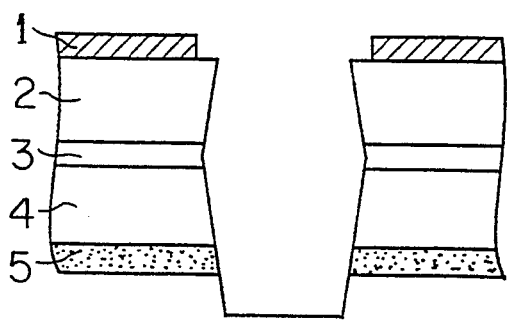
FIGS. 8A and 8B show another varied shapes of the isolating grooves encircled by dotted lines shown in FIG. 2
Figure 8B:
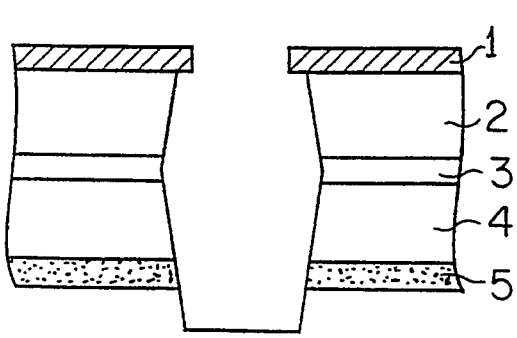

FIG. 8A shows the light emitting element where the end of an electrode 1 is disposed inside the end of the cladding layer 2. FIG. 8B shows the light emitting element where the end of the electrode 1 is extended over the cladding layer 2.

Figure 9A:
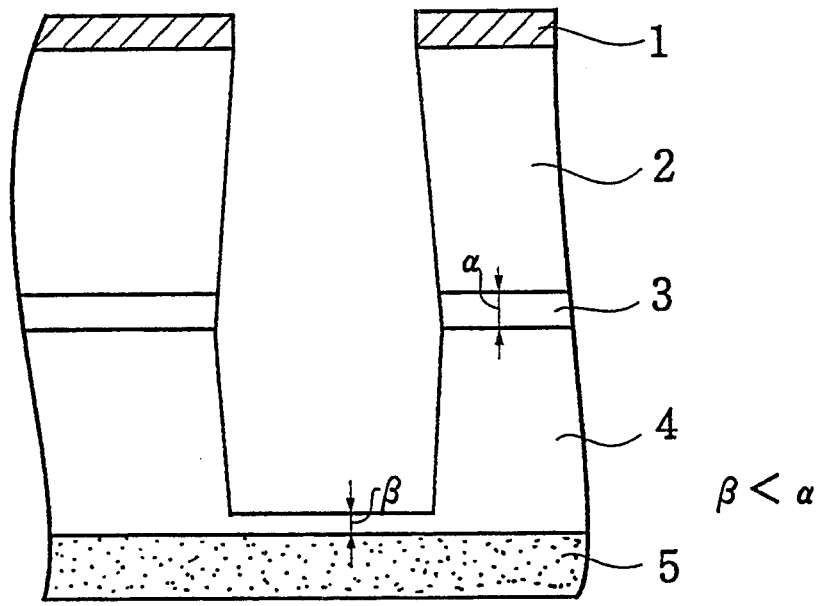
FIG. 9A and 9B show other variations of the isolating groove shapes based on a basic best-mode shape therefor shown in FIG. 4.
Figure 9B:
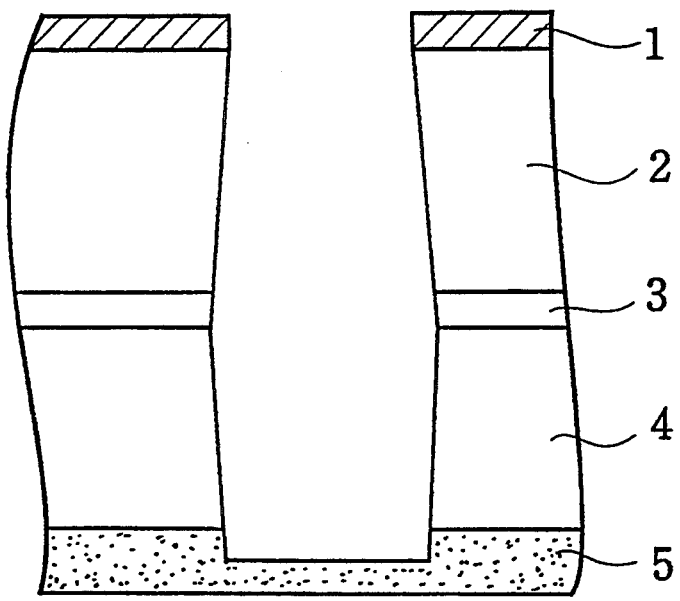

In addition to the basic best-mode shape for the isolating groove, with reference to FIG. 9A, the isolating groove may be disposed Just above the current restriction layer 5 and without penetrating the current restriction layer 5. Distance β away from the upper surface of the current restriction layer 5 is preferably smaller than the thickness α of the active layer 3. Alternatively, with reference to FIG. 9B, a bottom end of the isolating groove may be located in the current restriction layer 5.

In the above embodiments, the three-point light emitting element has been described. However, the present invention can be utilized for a light emitting element whose structure has two points or points equal to or greater than four. Furthermore, the present invention may be implemented for a case where the light emitting points have an arbitrary arrangement in two dimensions.

Moreover, the present invention may be implemented for the light emitting element using InGaAlP in which red to green light emitting is possible in a similar manner described in the above as in GaAlAs. In this case, the crystal ratio is preferably such that $In_{0.5}(Ga_{l-x}Al_x)_{0.5}P$ where $0 \leq x < 1$. It shall be further appreciated that GaP and $Ga As_{l-x} P_x$ where $0 \leq x < 1$ may serve as good as well in the similar manner as in GaAlAs As.

In summary, by implementing the present invention as mentioned above, the interval between the adjacent isolation regions which are the light emitting regions of the light emitting element in the neighborhood of the active layer are made equal to or wider than that of the opening portion of the surface of the light emitting element by means of the reactive ion etching technique. In other words, the upper end of a plurality of grooves which electrically separates the LED are made vertical or in the direction inside the vertical line of a pn junction surface of the element. Therefore, even if the light is irradiated upwards from the light emitting region of the LED end, such unwanted light is sufficiently suppressed from being emitted outwardly because the light is reflected by the GaAlAs As crystal. Thus, the present invention can realize to provide the semiconductor light emitting element in which the light leakage from the active layer end of the light emitting element is minimally suppressed.

For example, the present invention realizes to significantly reduce the interval between the elements when used for the automatic focusing mechanism. Moreover, the present invention achieves to reduce occurrence frequency of the mistaken measurement to 1% from the current 5%. As a result, an area occupancy thereof in a semiconductor chip can be significantly reduced, thus minimizing a product cost thereof and providing a semiconductor light emitting element with a significantly increased distance-measuring accuracy.

Besides those already mentioned above, many modifications and variations of the above embodiments may be made without departing from the novel and advantageous features of the present invention. Accordingly, all such modifications and variations are intended to be included within the scope of the appended claims.

What is claimed is:

1. A semiconductor light emitting element comprising a GaAlAs current restriction layer disposed over a GaAs semiconductor substrate and having conductive regions provided therein and a p-n junction, including a light emitting region, disposed over the current restriction layer, the light emitting element further comprising:

a plurality of grooves extending in substantially perpendicular relation to the p-n junction from openings in a surface of the light emitting element through the light emitting region to form a plurality of light emitting diodes in electrically isolated interrelation; and opposed end faces of the light emitting region exposed at opposed sidewalls of each of the grooves, the opposed end faces of the light emitting region having an angular relationship with the p-n junction such that leakage light is emitted by the opposed end faces into the grooves, the opposed end faces of the light emitting region having a greater lateral spacing than a corresponding lateral dimension of the surface openings, and the opposed sidewalls having surface configurations effective to inhibit the leakage light from escaping the grooves through the surface openings.

2. The semiconductor light emitting element of claim 1, wherein the light emitting element is of a double heterojunction structure having a p-type $Ga_{1-w}Al_wAs$ cladding layer disposed over the current restriction layer provided as an n-type $Ga_{1-x}Al_x$ current restriction layer, a p-type $Ga_{1-z}Al_zAs$ active layer disposed over the p-type cladding layer to provide the light emitting region, and an n-type $Ga_{1-y}Al_yAs$ cladding layer disposed over the p-type active layer to provide the p-n junction, wherein stoichiometric ratios X, Y, Z, and W of Al in the double heterojunction structure satisfy a relation in the n-type cladding layer, p-type active layer, p-type cladding layer, and n-type current restriction layer, such that $0 \leq X, Z \leq 0.4$, and $Z < Y, W$.

3. The semiconductor light emitting element of claim 1, wherein the plurality of the grooves are formed by a reactive ion etching technique using at least one of gas consisting of $SiCl_4$, HCl, $PCl_3$, $CH_4$ plus $H_2$, $BBr_3$ and HBr.

4. The semiconductor light emitting element of claim 1, wherein the plurality of the grooves are formed by a reactive ion etching technique using at least one of gas consisting of $BCl_3$, $Cl_2$, and Ar.

5. The semiconductor light emitting element of claim 4, claim 3 or claim 1, wherein the light emitting region is formed of at least one of GaAlAs As, InGaAlP, GaP and GaAsP.

6. The semiconductor light emitting element of claim 5, wherein stoichiometric ratio is such that $In_{0.5}(Ga_{1-x}Al_x)_{0.5}P$ and $GaAs_{1-x}P_x$ where $0 \leq x < 1$.

* * * * *